(12) United States Patent
Arai et al.

(10) Patent No.: US 11,950,503 B2
(45) Date of Patent: Apr. 2, 2024

(54) ORGANIC MATERIAL AND PHOTOELECTRIC CONVERSION ELEMENT

(71) Applicants: RICOH COMPANY, LTD., Tokyo (JP); KYUSHU UNIVERSITY, NATIONAL UNIVERSITY CORPORATION, Fukuoka (JP)

(72) Inventors: Ryota Arai, Shizuoka (JP); Takuma Yasuda, Fukuoka (JP); Seiichi Furukawa, Fukuoka (JP); Narumi Sato, Fukuoka (JP)

(73) Assignees: Ricoh Company, Ltd., Tokyo (JP); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 795 days.

(21) Appl. No.: 16/980,302

(22) PCT Filed: Feb. 20, 2019

(86) PCT No.: PCT/JP2019/006308
§ 371 (c)(1),
(2) Date: Sep. 11, 2020

(87) PCT Pub. No.: WO2019/176488
PCT Pub. Date: Sep. 19, 2019

(65) Prior Publication Data
US 2021/0043846 A1    Feb. 11, 2021

(30) Foreign Application Priority Data
Mar. 15, 2018   (JP) .................... JP2018-047754

(51) Int. Cl.
*H10K 85/60*    (2023.01)
*H10K 85/20*    (2023.01)
*H10K 50/15*    (2023.01)
*H10K 50/16*    (2023.01)

(52) U.S. Cl.
CPC ......... *H10K 85/657* (2023.02); *H10K 85/211* (2023.02); *H10K 85/655* (2023.02); *H10K 50/15* (2023.02); *H10K 50/16* (2023.02)

(58) Field of Classification Search
CPC ... H10K 85/657; H10K 85/211; H10K 85/655
See application file for complete search history.

(56) References Cited

U.S. PATENT DOCUMENTS

2016/0260912 A1   9/2016   Arai et al.
2017/0222150 A1   8/2017   Arai et al.
(Continued)

FOREIGN PATENT DOCUMENTS

| CN | 105315298 B | 10/2017 |
|---|---|---|
| JP | 2016-164128 | 9/2016 |
| JP | 2016-175868 | 10/2016 |
| JP | 2017-206479 | 11/2017 |
| WO | WO2018/032945 A1 | 2/2018 |

OTHER PUBLICATIONS

Japanese Office Action dated Aug. 27, 2021 in Japanese Application No. 2018-047754, with English translation, 5 pages.
(Continued)

*Primary Examiner* — Kourtney R S Carlson
(74) *Attorney, Agent, or Firm* — Grüneberg and Myers PLLC

(57) ABSTRACT

An organic material represented by General Formula (1): where, in General Formula (1), $R_1$ is an alkyl group having 6 carbon atoms or more but 20 carbon atoms or less; n is an integer of from 1 through 3; X1 to X4 are each a hydrogen atom or a fluorine atom; and Z is a compound represented by General Formula (2), (3), or (4) below: where, in General Formulae (2) to (4), $R_2$, $R_3$, and $R_4$ are each an alkyl group having 6 carbon atoms or more but 20 carbon atoms or less; and Y is an oxygen atom or a sulfur atom.

(Continued)

(1)

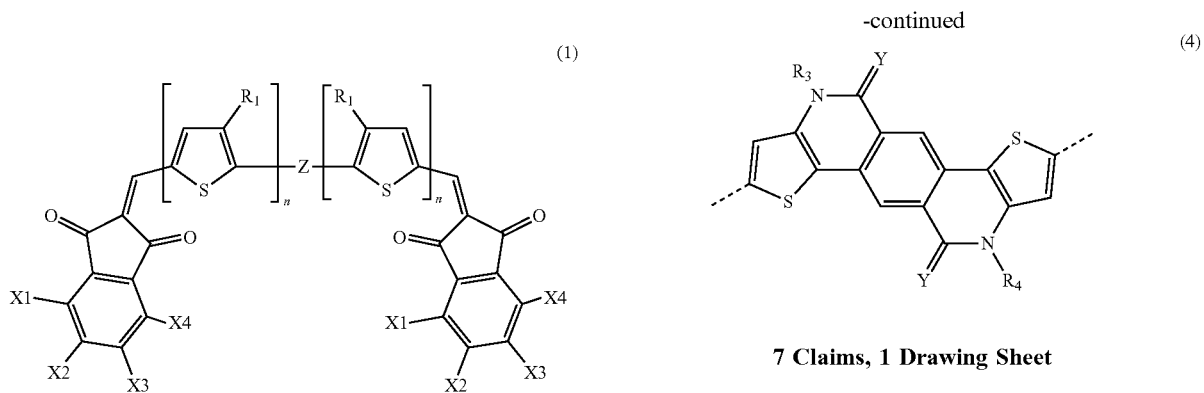

(2)

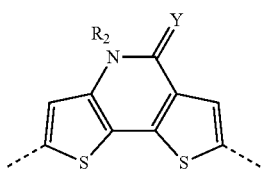

(3)

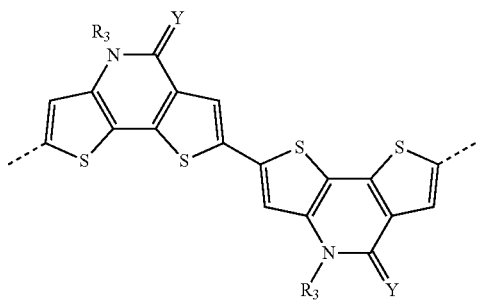

(4)

7 Claims, 1 Drawing Sheet (56) References Cited

U.S. PATENT DOCUMENTS

2017/0243698 A1  8/2017  Kanei et al.
2017/0338424 A1  11/2017 Arai et al.
2017/0358399 A1  12/2017 Matsuyama et al.
2018/0053863 A1  2/2018  Tanaka et al.
2018/0197688 A1  7/2018  Horiuchi et al.
2018/0198083 A1  7/2018  Tanaka et al.
2018/0330890 A1  11/2018 Tanaka et al.

OTHER PUBLICATIONS

Feng, et al., "*All-small molecule organic solar cells based on an electron donor incorporating binary electron-deficient units*", Journal of Materials Chemistry A, vol. 4, 2016, pp. 6056-6063.

Alexander M. Schneider et a.: Wide bandgap OPV polymers based on pyridinonedithiophene unit with efficiency >5%, Chemical Science, vol. 6, No. 8, 2015, pp. 4860-4866, XP055587041, United Kingdom, ISSN: 2041-6520, DOI: 10.1039/c5sc01427a.

Guangrui He et all: "Efficient small molecule bulk heterojunction solar cells with high fill factors via introduction of π-stacking moieties as end group", Journal of Materials Chemistry A, vol. 1, No. 5, Nov. 29, 2012 (Nov. 29, 2012), pp. 1801-1809, XP055586791, GB, ISSN: 2050-7488, DOI: 10.1039/c2ta00496h.

Dan Deng et al: "Fluorination-enabled optimal morphology leads to over 11% efficiency for inverted small-molecule organic solar cells", Nature Communications, vol. 7 , No. 1, 2016, pp. 1-9, XP055586795, DOI: 10.1038/ncomms13740.

International Search Report dated May 28, 2019 for counterpart International Patent Application No. PCT/JP2019/006308 filed Feb. 20, 2019.

Written Opinion dated May 28, 2019 for counterpart International Patent Application No. PCT/JP2019/006308 filed Feb. 20, 2019.

ORGANIC MATERIAL AND PHOTOELECTRIC CONVERSION ELEMENT

TECHNICAL FIELD

The present disclosure relates to an organic material and a photoelectric conversion element.

BACKGROUND ART

In recent years, the power for driving electric circuits has become extremely low. Preparing for the coming IoT society, various electronic parts, such as sensors, have been able to be driven with very low electric power (order of microwatt). As utilization of sensors, applications of the sensors for energy harvesting elements have been expected as self-sufficient energy supplies capable of generating and consuming power in-situ. Among the energy harvesting elements, photoelectric conversion elements have been attracted attentions as elements capable of generating power anywhere as long as there is light. As energy harvesting elements, particularly demanded are photoelectric conversion elements capable of efficiently generating electric power with indoor light, such as light of fluorescent lamps, and light of LED lamps.

It has been known that among the properties of the photoelectric conversion element, a short-circuit current density is proportional to an amount of light, when a light source is identical. The above-described tendency is also applied to so-called organic thin film solar cells. Know organic thin film solar cells have been developed with targeting sunlight as a light source. Among them, developments of p-type organic semi-conductors have been particularly actively performed.

Meanwhile, photoelectric conversion elements targeting indoor light as a light source use light of fluorescent lamps or LED lamps as target light, not sunlight. Therefore, there is a need that photoelectric conversion elements exhibit high current values with light of fluorescent lamps or LED lamps. Since light from fluorescent lamps or LED lamps has a spectrum only in a visible light region, unlike sunlight, spectrum matching is low with a p-type organic semiconductor used for a known photoelectric conversion element targeting sunlight as a light source. Therefore, the photoelectric conversion element has a disadvantage that a current value is low with light from fluorescent lamps or LED lamps. Accordingly, there is a need for developing materials suitable for spectra of light from fluorescent lamps or LED lamps.

Specifically, there is a need for a material having a shorter spectrum than an absorption spectrum of a p-type organic semiconductor targeting sunlight as a light source.

In NPL 1, a material having relatively short absorption wavelength is disclosed, and an organic material exhibiting a relative high current value under pseudo sunlight is disclosed. However, properties of the material with low illuminance are not clearly described in NPL 1.

CITATION LIST

Patent Literature

[NPL 1] Chem. Sci., 2015, 6, 4860

SUMMARY OF INVENTION

Technical Problem

The present disclosure has an object to provide an organic material that can obtain high photoelectric conversion efficiency with very weak light, such as indoor light.

Solution to Problem

According to one aspect of the present disclosure, an organic material is represented by General Formula (1) below.

General Formula (1)

In General Formula (1), $R_1$ is an alkyl group having 6 carbon atoms or more but 20 carbon atoms or less, n is an integer of from 1 through 3, X1 to X4 are each a hydrogen atom or a fluorine atom, and Z is a compound represented by General Formula (2), (3), or (4) below.

General Formula (2)

General Formula (3)

General Formula (4)

In General Formulae (2) to (4), $R_2$, $R_3$ and $R_4$ are each an alkyl group having 6 carbon atoms or more but 20 carbon atoms or less, and Y is an oxygen atom or a sulfur atom.)

Advantageous Effects of Invention

The present disclosure can provide an organic material that can obtain high photoelectric conversion efficiency with very weak light, such as indoor light.

DESCRIPTION OF EMBODIMENTS

An organic material and a photoelectric conversion element according to the present disclosure will be described below with reference to drawings.

Note that, the present disclosure is not limited to embodiments described below, and other embodiments, additions to the embodiments, and eliminations from the embodiments are also included in a scope of the present disclosure, as long as the above-mentioned changes are made within a scope at which a person skilled in the art can easily arrive, and any of the embodiments can exhibit functions and effects of the present disclosure.

In the present disclosure, the term "photoelectric conversion element" means an element which converts optical energy into electric energy, or an element which converts electric energy into optical energy. Specific examples of the photoelectric conversion element include solar cells and photo diodes.

The photoelectric conversion element will be described in detail below.

<<Organic Material>>

The organic material of the present disclosure is represented by General Formula (1).

General Formula (1)

In General Formula (1), $R_1$ is an alkyl group having 6 carbon atoms or more but 20 carbon atoms or less; n is an integer of from 1 through 3; X1 to X4 are each a hydrogen atom or a fluorine atom; and Z is a compound represented by General Formula (2), (3), or (4).

General Formula (2)

General Formula (3)

General Formula (4)

In General Formulae (2) to (4), $R_2$, $R_3$, and $R_4$ are each an alkyl group having 6 carbon atoms or more but 20 carbon atoms or less; and Y is an oxygen atom or a sulfur atom.

Each of $R_1$, $R_2$, $R_3$, and $R_4$ is an alkyl group having 6 carbon atoms or more but 20 carbon atoms or less, and examples of the alkyl group include an n-hexyl group, an n-octyl group, an n-dodecyl group, an n-hexadecyl group, a 2-ethylhexyl group, a 2-butyloctyl group, and a 2-octyldodecyl group. $R_1$ is preferably an n-hexyl group or an n-octyl group. $R_2$, $R_3$, and $R_4$ are each preferably a 2-octyldodecyl group.

n is an integer of from 1 through 3, and is preferably an integer of 1 or 2.

The organic material represented by General Formula (1) is preferably any of compounds represented by General Formula (5), General Formula (6), and General Formula (7).

General Formula (5)

In General Formula (5), $R_5$ is an alkyl group having 12 carbon atoms or more but 20 carbon atoms or less; $R_6$ is an alkyl group having 6 carbon atoms or more but 12 carbon atoms or less; X1 to X4 are each a hydrogen atom or a fluorine atom; Y is an oxygen atom or a sulfur atom; and n is an integer of from 1 through 3.

General Formula (6)

In General Formula (6), $R_7$ is an alkyl group having from 12 carbon atoms through 20 carbon atoms; $R_8$ is an alkyl group having from 6 carbon atoms through 12 carbon atoms; X1 to X4 are each a hydrogen atom or a fluorine atom; Y is an oxygen atom or a sulfur atom; and n is an integer of from 1 through 3.

General Formula (7)

In General Formula (7), $R_9$ is an alkyl group having from 12 carbon atoms through 20 carbon atoms; $R_{10}$ is an alkyl group having from 6 carbon atoms through 12 carbon atoms; X1 to X4 are each a hydrogen atom or a fluorine atom; Y is an oxygen atom or a sulfur atom; and n is an integer of from 1 through 3.

Specific examples of the organic material represented by General Formula (1) include compounds presented in Tables 1-1 and 1-2, but the present disclosure is not limited to the examples below.

TABLE 1-1

| Examplary Compound No. | Z | R1 | n | R2 or R3 or R4 | Y | X1 | X2 | X3 | X4 |
|---|---|---|---|---|---|---|---|---|---|
| 1 | (structure) | n-hexyl | 1 | 2-butyloctyl | O | H | H | H | H |
| 2 | (structure) | n-hexyl | 1 | 2-octyldodecyl | O | H | H | H | H |
| 3 | (structure) | n-hexyl | 2 | 2-octyldodecyl | O | H | H | H | H |
| 4 | (structure) | n-hexyl | 2 | 2-octyldodecyl | S | H | H | H | H |
| 5 | (structure) | n-dodecyl | 2 | 2-octyldodecyl | O | H | H | H | H |
| 6 | (structure) | n-hexyl | 3 | 2-octyldodecyl | O | H | H | H | H |
| 7 | (structure) | n-dodecyl | 3 | 2-octyldodecyl | O | H | H | H | H |

TABLE 1-1-continued

| Examplary Compound No. | Z | R1 | n | R2 or R3 or R4 | Y | X1 | X2 | X3 | X4 |
|---|---|---|---|---|---|---|---|---|---|
| 8 | (structure) | n-hexyl | 1 | 2-butyloctyl | O | H | H | H | H |
| 9 | (structure) | n-hexyl | 1 | 2-octyldodecyl | O | H | H | H | H |
| 10 | (structure) | n-hexyl | 2 | 2-octyldodecyl | O | H | H | H | H |
| 11 | (structure) | n-hexyl | 2 | 2-octyldodecyl | S | H | H | H | H |
| 12 | (structure) | n-dodecyl | 2 | 2-octyldodecyl | O | H | H | H | H |

TABLE 1-2

| Examplary Compound No. | Z | R1 | n | R2 or R3 or R4 | Y | X1 | X2 | X3 | X4 |
| --- | --- | --- | --- | --- | --- | --- | --- | --- | --- |
| 13 | (structure) | n-hexyl | 3 | 2-octyldodecyl | O | H | H | H | H |
| 14 | (structure) | n-dodecyl | 3 | 2-octyldodecyl | O | H | H | H | H |
| 15 | (structure) | n-hexyl | 1 | 2-hexyldecyl | O | H | H | H | H |
| 16 | (structure) | n-hexyl | 1 | 2-hexyldecyl | O | H | H | H | H |
| 17 | (structure) | n-hexyl | 2 | 2-hexyldecyl | O | H | H | H | H |

TABLE 1-2-continued

| Examplary Compound No. | Z | R1 | n | R2 or R3 or R4 | Y | X1 | X2 | X3 | X4 |
|---|---|---|---|---|---|---|---|---|---|
| 18 | | n-hexyl | 2 | 2-hexyldecyl | S | H | H | H | H |
| 19 | | n-dodecyl | 2 | 2-hexyldecyl | O | H | H | H | H |
| 20 | | n-hexyl | 3 | 2-hexyldecyl | O | H | H | H | H |
| 21 | | n-dodecyl | 3 | 2-hexyldecyl | O | H | H | H | H |
| 22 | | n-hexyl | 2 | 2-octyldodecyl | O | F | H | H | F |
| 23 | | n-hexyl | 2 | 2-octyldodecyl | O | F | H | H | F |

TABLE 1-2-continued

| Examplary Compound No. | Z | R1 | n | R2 or R3 or R4 | Y | X1 | X2 | X3 | X4 |
|---|---|---|---|---|---|---|---|---|---|
| 24 |  | n-hexyl | 2 | 2-hexyldecyl | O | F | H | H | F |

(N-Type Semiconductor Material)

Examples of the n-type semiconductor material include fullerenes and fullerene derivatives.

Among the above-listed examples, fullerene derivatives are preferable in view of charge separation and charge transport.

As the fullerene derivative, a fullerene derivative appropriately synthesized may be used, or a commercial product of the fullerene derivative may be used. Examples of the commercial product include PC71BM (phenyl C71 butyric acid methyl ester), PC61BM, and indene fullerene bis adducts.

Note that, the photoelectric conversion layer may include, as well as the n-type organic material, an inorganic compound, such as zinc oxide, and titanium oxide. An amount of the n-type organic material relative to a total amount of a solution for the photoelectric conversion layer is preferably from 0.5% by mass through 10% by mass.

The organic solvent is not particularly limited and may be appropriately selected depending on the intended purpose. Examples of the organic solvent include methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, trichlorobenzene, chloronaphthalene, dimethylformamide, dimethyl-sulfoxide, N-methylpyrrolidone, and gamma-butyrolactone. The above-listed examples may be used alone or in combination. Among the above-listed examples, chlorobenzene, chloroform, and ortho-dichlorobenzene are preferable.

The above-mentioned other components are not particularly limited and may be appropriately selected depending on the intended purpose. Examples of the above-mentioned other components include various additives, such as 1,8-diiodooctane, 1,8-octanedithiol, and 1-chloronaphthalene.

<Photoelectric Conversion Layer>

The photoelectric conversion layer includes at least a thin film of the organic material of the present disclosure and a thin film of an n-type semiconductor material, and may further include other components according to the necessity.

An average thickness of the photoelectric conversion layer is from 50 nm through 400 nm, more preferably from 100 nm through 300 nm. When the average thickness is less than 50 nm, an amount of light absorbed by the photoelectric conversion layer is small, and generation of carriers may be insufficient. When the average thickness is greater than 400 nm, transport efficiency of carriers generated by light absorption may be further decreased.

In the present disclosure, the organic material and the n-type semiconductor material may be sequentially formed to form a flat junction interface. In order to increase a junction interface, however, a bulk heterojunction where the above-mentioned materials are three-dimensionally mixed is preferably formed.

When materials having high solubility are used, the materials are dissolved in a solvent to form a solution where a p-type organic material and the n-type organic material are mixed in the state of molecules, and the solution is applied and then dried to remove the solvent, to thereby form the bulk heterojunction. Moreover, a heating treatment may be performed to optimize an aggregation state of each semiconductor.

When materials having poor solubility are used, the materials are dispersed in a solvent, in which the organic material for use in the present disclosure is dissolved, to prepare a solution, and the solution is applied to form a mixture layer. In this case, a heating treatment may be further performed to optimize an aggregation state of each semiconductor.

The organic material for use in the present disclosure has a deep HOMO level and air stability of the organic material excellent, as well as that an improvement of open-circuit voltage owing to the material is expected. In addition, an organic semiconductor film having a regular coagulate state, such as crystallinity, and orientation, can be more effectively formed by introducing a soluble group, such as an alkyl group, into the above-mentioned rigid molecular skeleton, while maintaining solubility to typical organic solvents. In the above-mentioned state of high regularity, high charge transport can be expected. Particularly, in General Formulae (2) to (3) in General Formula (1), an alkyl group substituted by a nitrogen atom is preferably a branched-chain alkyl group. Since the alkyl chain is a branched chain, solubility is significantly enhanced. As a result, an organic thin film can be made thick. Since the organic thin film is thick, a large amount of light can be absorbed, leading to an improvement of power generation.

In the case where a photoelectric conversion layer is formed by mixing the organic material represented by General Formula (1) and a n-type semiconductor material, the organic material represented by General Formula (1) and the n-type semiconductor material are added to a solvent at the predetermined mass ratio, the organic material and the n-type semiconductor material are dissolved by a method, such as heating, stirring, ultrasonic wave radiation, to form a solution, and the solution is applied onto an electrode. In the formation of the photoelectric conversion layer, use of two or more solvents in mixture can improve photoelectric conversion efficiency of a photoelectric conversion element.

Examples of a formation method of a thin film of an organic material to be the photoelectric conversion layer include spin coating, blade coating, slit-die coating, screen-printing coating, bar-coater coating, mold coating, print transfer, dip coating, inkjet printing, spray coating, and vacuum vapor deposition. Among the above-listed examples, the formation method can be appropriately selected depending on properties of a thin organic material film to be produced, such as thickness controlling, and orientation controlling.

In the case where spin coating is performed, for example, a concentration of the organic material having a structure represented by General Formula (1) and the n-type semiconductor material is preferably from 10 mg/mL through 100 mg/mL (a mass of the organic material having a structure represented by General Formula (1) and the n-type semiconductor material relative to a volume of a solution including the organic material having a structure represented by General Formula (1), the n-type semiconductor material, and a solvent). At the above-mentioned concentration, a uniform photoelectric conversion layer can be easily formed.

In order to remove the organic solvent, an annealing treatment may be performed on the produced photoelectric conversion layer under reduced pressure or an inert atmosphere (a nitrogen or argon atmosphere). A temperature of the annealing treatment is preferably from 40 degrees Celsius through 300 degrees Celsius, and more preferably from 50 degrees Celsius through 150 degrees Celsius. Since the annealing treatment is performed, moreover, stacked layers are penetrated into each other at interfaces, to thereby increase a contact effective area. As a result, a short-circuit current may be increased. Note that, the annealing treatment may be performed after forming electrodes.

(Photoelectric Conversion Element)

Figure 1:
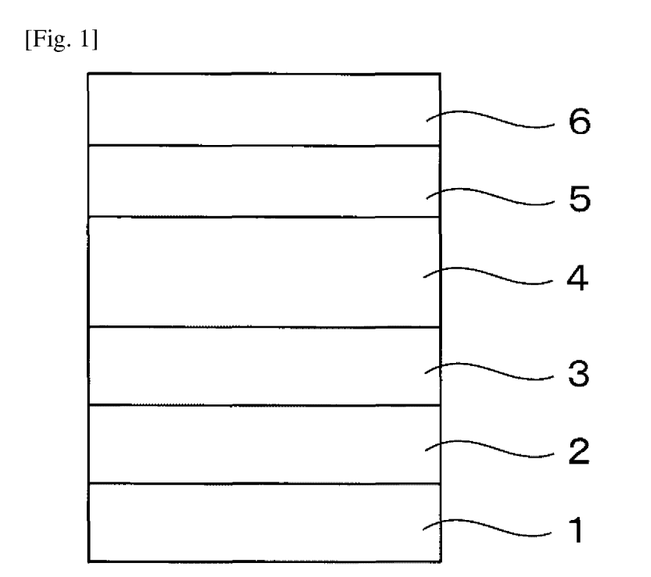
FIG. 1 is a schematic view illustrating one aspect of a photoelectric conversion element according to the present disclosure.
Figure 2:
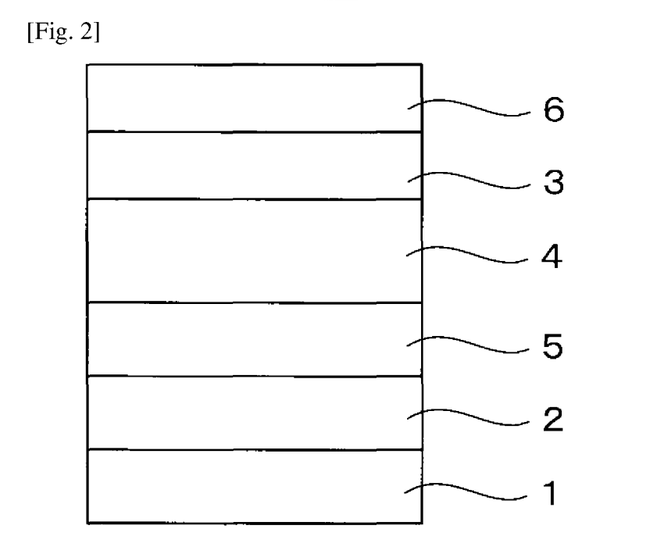
FIG. 2 is a schematic view illustrating another aspect of the photoelectric conversion element according to the present disclosure.

The photoelectric conversion element is a photoelectric conversion element, in which a first electrode, an electron-transporting layer, a photoelectric conversion layer, a hole-transporting layer, and a second electrode are sequentially laminated on a substrate, or a photoelectric conversion element, in which a first electrode, a hole-transporting layer, a photoelectric conversion layer, an electron-transporting layer, and a second electrode are sequentially laminated on a substrate. The photoelectric conversion layer includes a thin film of the organic material of the present disclosure. The photoelectric conversion element of the present disclosure will be described with reference to drawings. FIG. 1 illustrates a structure where a first electrode 2, an electron-transporting layer 3, a photoelectric conversion layer 4, a hole-transporting layer 5, and a second electrode 6 are sequentially disposed on a substrate 1. FIG. 2 illustrates a structure where a first electrode 2, a hole-transporting layer 5, a photoelectric conversion layer 4, an electron-transporting layer 3, and a second electrode 6 are sequentially disposed on a substrate 1.

<Substrate>

The substrate for use in the present disclosure is not particularly limited and any of substrates known in the art can be used as the substrate. The substrate 1 is preferably a substrate formed of a transparent material. Examples of the substrate include glass, a transparent plastic plate, a transparent plastic film, and an inorganic transparent crystal.

<Electrodes>

As at least one of electrodes, an electrode transparent to visible light is used, and the other electrode may be transparent or opaque.

The electrode transparent to visible light is not particularly limited and any of electrodes typically used in photoelectric conversion elements or liquid crystal panels may be used. Examples of the transparent electrode include conductive metal oxides, such as tin-doped indium oxide (referred to as "ITO" hereinafter), fluorine-doped tin oxide (referred to as "FTO" hereinafter), antimony-doped tin oxide (referred to as "ATO" hereinafter), and aluminium- or gallium-doped zinc oxide (referred respectively as "AZO," and "GZO" hereinafter).

An average thickness of the electrode transparent to visible light is preferably from 5 nm through 10 micrometers, and more preferably from 50 nm through 1 micrometer.

In order to maintain certain hardness, the electrode transparent to visible light is preferably disposed on a substrate formed of a material transparent to visible light. A product of the electrode and the substrate that are integrated can also be used. Examples of the integrated product include FTO coated glass, ITO coated glass, zinc oxide-aluminium coated glass, FTO coated transparent plastic films, and ITO coated transparent plastic films.

The electrode transparent to visible light may be an electrode containing a substrate (e.g., a glass substrate) on which a metal electrode having the structure through which light can pass (e.g., a mesh-patterned structure or a stripe-patterned structure) is disposed. Alternatively, the electrode transparent to visible light may be an electrode where carbon nanotube or graphene is laminated on the substrate in a manner that transparency is secured. The above-listed examples may be used alone, or in combination, or in the state of a laminate.

In order to reduce substrate resistance, moreover, a metal lead wire may be used. Examples of a material of the metal lead wire include metals, such as aluminium, copper, silver, gold, platinum, and nickel. The metal lead wire is disposed on the substrate, for example, by vapor deposition, sputtering, or crimping, followed by disposing ITO or FTO on the metal.

In the case where an opaque electrode is used for either an electron-collector electrode or a hole-collector electrode, examples of a material of the electrode include metals (e.g., platinum, gold, silver, copper, and Al) and graphite. In case of the opaque electrode, a thickness of the electrode is not particularly limited and the electrode may have a laminate structure of one or two or more materials.

<Electron-Transporting Layer (First Layer)>

A material for forming the electron-transporting layer may be appropriately selected depending on the intended purpose. For example, the electron-transporting layer is formed by applying an electron-accepting organic material [e.g., perylenetetracarboxylic anhydride, perylenetetracarboxylic diimide, oxazole derivatives, triazol derivatives, phenanthroline derivatives, phosphine oxide derivatives, fullerene compounds, CNT, and CN-PPV], or an inorganic material (e.g., zinc oxide, titanium oxide, lithium fluoride, and calcium metal) through a sol-gel method or sputtering. Among the above-listed examples, metal oxides, such as zinc oxide, titanium oxide, and tin oxide, are preferable. An average thickness of the electron-transporting layer is not particularly limited and may be appropriately selected depending on the intended purpose. The electron-transporting layer preferably covers the entire surface as thin as possible, and more preferably has an average thickness of from 10 nm through 100 nm. A film of basic carboxylic acid may be formed on the electron-transporting layer. Specific examples of the basic carboxylic acid include 4-(N,N- dimethylamino)-benzoic acid, 4-(N,N-diethylamino)-benzoic acid, and 4-(N,N-dibenzylamino)-benzoic acid.
<Hole-Transporting Layer>

The hole-transporting layer is disposed to improve a collection efficiency of holes. Specifically, the hole-transporting layer is formed by depositing a hole-transporting organic compound, such as a conductive polymer [e.g., PEDOT:PSS (polyethylene dioxythiophene:polystyrene sulfonic acid)] and an aromatic amine derivative, or an inorganic compound having hole-transporting properties, such as molybdenum oxide, vanadium oxide, and nickel oxide, through spin coating, a sol-gel method, or sputtering. In the present disclosure, molybdenum oxide is preferably disposed. An average thickness of the hole-transporting layer is not particularly limited and may be appropriately selected depending on the intended purpose. The hole-transporting layer preferably covers the entire surface as thin as possible, and the average thickness of the hole-transporting layer is more preferably from 1 nm through 50 nm.
<Other Members>

The above-mentioned other members are not particularly limited and may be appropriately selected depending on the intended purpose. Examples of the members include a gas-barrier layer, a protective layer, and a buffer layer.

Examples of a material of the gas-barrier layer include inorganic materials, such as silicon nitrate and silicon oxide.

The photoelectric conversion element of the present disclosure may have a series junction formed by stacking two or more photoelectric conversion layers (making as a tandem) via one or more intermediate electrodes.

Examples of the laminate structure include a structure including a substrate 1/lower electrode 2/hole-transporting layer 3/first photoelectric conversion layer 4/intermediate electrode/second photoelectric conversion layer/electron-transporting layer 5/upper electrode 6. Use of the laminate can improve open-circuit voltage.

In case of the above-described laminate structure, at least one of the photoelectric conversion layers includes an organic material thin film formed of the organic material represented by General Formula (1), and the other photoelectric conversion layer include another organic material having an absorption wavelength different from that of the organic compound represented by General Formula (1), in order to prevent reduction of short-circuit current.

Examples of the organic material include: polymer materials, such as polythiophene compounds, polyphenylene vinylene compounds, polyfluorene compounds, and polyphenylene compounds; and low-molecular-weight materials, such as various porphyrins, and phthalocyanine.

The photoelectric conversion element of the present disclosure will be described with reference to drawings hereinafter.

FIG. 1 illustrates a structure where a first electrode 2, an electron-transporting layer 3, a photoelectric conversion layer 4, a hole-transporting layer 5, and a second electrode 6 are sequentially disposed on a substrate 1. FIG. 2 is a structure where a first electrode 2, a hole-transporting layer 5, a photoelectric conversion layer 4, an electron-transporting layer 3, and a second electrode 6 are sequentially disposed on a substrate 1.
<Use>

Recently, there is a need for, especially as an energy harvesting element, a photoelectric conversion element capable of efficiently generating electric power with weak light. Typical examples of weak light include LED light, and light of a fluorescent lamp. The above-mentioned light is typically used indoor, and is called indoor light. The illuminance of the indoor light is from about 20 Lux through about 1,000 Lux, and the indoor light is very weak light compared to direct sunlight (about 100,000 Lux). The photoelectric conversion element of the present disclosure exhibits high conversion efficiency with weak light, such as the above-mentioned indoor light, and can be applied for a power supply by using in combination with a circuit board capable of controlling the generated electric current. Examples of a device utilizing the power supply include calculators, and watches. Other than the above-listed examples, a power supply containing the photoelectric conversion element of the present disclosure can be used in mobile phones, electric organizers, and electronic paper. Moreover, a power supply containing the photoelectric conversion element of the present disclosure can also be used as an auxiliary power for extending continuous usage of rechargeable or battery-driven electric appliances. Furthermore, the photoelectric conversion element of the present disclosure can be also applied as an image sensor.

EXAMPLES

The present disclosure will be described in more detail by way of the following Examples. However, the present disclosure should not be construed as being limited to these Examples.

Synthesis Examples of Exemplary Compounds

Synthesis Examples of Exemplary Compound 3, Exemplary Compound 10, Exemplary Compound 17, and Exemplary Compound 24 will be presented below.

Measurement results (spectrum values) of nuclear magnetic resonance (NMR) spectroscopy of Exemplary Compounds and precursors of Exemplary Compounds are presented. Moreover, results of mass spectroscopy are presented depending on compounds.

Synthesis of Exemplary Compound 3

(1-1) Synthesis of N-(2-octyldodecyl)thiophen-3-amine (Compound 1)

A Schlenk flask was charged with 3-bromothiophene (24.45 g, 150 mmol), 2-hexyldecan-1-amine (53.56 g, 180 mmol), a copper powder (0.94 g, 15 mmol), copper(I) iodide (2.86 g, 15 mmol), tripotassium phosphate (63.38 g, 300 mmol), and 2-dimethylaminoethanol (150 mL) in a nitrogen atmosphere, and the resultant mixture was stirred for 45 hours with heating to 80 degrees Celsius in a light-shielded state. After returning the system to room temperature, an excessive amount of water was added and an organic layer was extracted with hexane. After washing the organic layer with water, the resultant was dried with anhydrous sodium sulfate. After removing solids through filtration, the solvent was removed by an evaporator, followed by performing purification with silica gel column chromatography (mobile phase:hexane), to thereby obtain Compound 1 in the state of brown oil (52.2 g, yield: 92%).
(NMR Spectrum Value)

$^1$H-NMR (400 MHz, CDCl$_3$): delta 7.14 (dd, J=5.2, 2.8 Hz, 1H), 6.61 (dd, J=5.2, 1.6 Hz, 1H), 5.91 (dd, J=2.8, 1.6 Hz, 1H), 3.57 (br, 1H), 2.96 (d, J=6.0 Hz, 2H), 1.62-1.55 (m, 1H), 1.35-1.20 (m, 32H), 0.88 (t, J=6.8 Hz, 6H).

(1-2) Synthesis of 2-bromo-N-(2-octyldodecyl)-N-(thiophen-3-yl)thiophene-3-carboxamide (Compound 2)

A Schlenk flask was charged with 2-bromothiophene-3-carboxylic acid (20.71 g, 100 mmol), dehydrated dichloromethane (150 mL), and dimethylformamide (few drops) in a nitrogen atmosphere and oxalyl chloride (19.04 g, 150 mmol) was slowly dripped to the mixture, and the resultant was stirred for 20 hours at room temperature. The solvent and the excess oxalyl chloride were removed to obtain 2-bromothiophne-3-carbonyl chloride. The obtained compound was provided for the next reaction without performing purification. In a Schlenk flask of a nitrogen atmosphere, the 2-bromothiophene-3-carbonyl chloride was dissolved in dehydrated tetrahydrofuran, and the resultant was cooled to 0 degrees Celsius. To the resultant solution, a mixture of Compound 1 (41.7 g, 110 mmol), trimethylamine (20 mL), and dehydrated tetrahydrofuran (150 mL) was slowly added. After stirring the resultant mixture overnight at room temperature, an excessive amount of water was added. After extracting the organic layer with hexane, the extracted organic layer was washed with water and dried with anhydrous sodium sulfate. After removing solids through filtration, the solvent was removed by an evaporator, and the resultant was purified by silica gel chromatography (mobile phase:hexane/chloroform=3:1, v/v), to thereby obtain Compound 2 in the state of yellow oil (37.4 g, yield: 68%).

(NMR Spectrum Value)

$^1$H-NMR (400 MHz, CDCl$_3$): 7.13 (s, 1H), 7.00 (dd, J=3.2, 2.0 Hz, 1H), 6.85 (s, 1H), 6.78 (s, 1H), 6.57 (d, J=4.4 Hz, 1H), 3.80 (d, J=6.4 Hz, 2H), 1.62-1.55 (m, 1H), 1.35-1.20 (m, 32H), 0.90-0.85 (m, 6H).

(Result of Mass Spectrometry)

MS (MALDI-TOF) m/z: [M]+, 567.22; Found, 568.02.

(1-3) Synthesis of 4-(2-octyldodecyl)dithieno[3,2-b:2',3'-d]pyridin-5(4H)-one (Compound 3)

A Schlenk flask was charged with Compound 2 (33.04 g, 60 mmol), palladium(II) acetate (1.35 g, 6 mmol), K$_2$CO$_3$ (12.44 g, 90 mmol), pivalic acid (2.04 g, 20 mmol), and dehydrated dimethylacetamide (300 mL) in a nitrogen atmosphere, and the resultant mixture was stirred for 18 hours with heating to 110 degrees Celsius. After returning the system to room temperature, an excessive amount of water was added and an organic layer was extracted with hexane. After washing the organic layer with water, the organic layer was dried with anhydrous sodium sulfate. After removing solids through filtration, the solvent was removed by an evaporator and the resultant was purified by silica gel column chromatography (mobile phase:hexane) to thereby obtain Compound 3 in the state of brown oil (22.04 g, yield: 75%).

(NMR Spectrum Value)

$^1$H-NMR (400 MHz, CDCl$_3$): delta 7.70 (d, J=5.2 Hz, 1H), 7.43 (d, J=5.2 Hz, 1H), 7.23 (d, 5.2 Hz, 1H), 7.08 (d, 5.2 Hz, 1H), 4.21 (d, 6.0 Hz, 2H), 2.03-1.95 (m, 1H), 1.40-1.15 (m, 32H), 0.90-0.84 (m, 6H).

(Result of Mass Spectrometry)

MS (MALDI-TOF) m/z: [M]+, 487.29; Found, 488.04.

(1-4) Synthesis of 2,7-dibromo-4-(2-octyldodecyl)dithieno[3,2-b:2',3'-d]pyridin-5(4H)-one (Compound 4)

A Schlenk flask was charged with Compound 3 (9.76 g, 20 mmol) and dehydrated tetrahydrofuran (100 mL) in a nitrogen atmosphere and the resultant mixture was cooled to 0 degrees Celsius. To the mixture, N-bromosuccinimide (7.12 g, 40 mmol) was slowly added, followed by stirring for 20 hours at room temperature in a light-shielded state. An excessive amount of water was added to the resultant and an organic layer was extracted with hexane. After washing the organic layer with water, the resultant was dried with anhydrous sodium sulfate. After removing solids through filtration, the solvent was removed by an evaporator, and the resultant was purified by silica gel column chromatography (mobile phase:hexane/chloroform=1:1, v/v), to thereby obtain Compound 4 in the state of yellow oil (5.16 g, yield: 40%).

(NMR Spectrum Values)

$^1$H-NMR (400 MHz, CDCl3): delta 7.63 (s, 1H), 7.05 (s, 1H), 4.20-4.10 (br, 2H), 1.96-1.91 (m, 1H), 1.54-1.28 (m, 36H), 0.90-0.86 (m, 6H).

(Result of Mass Spectrometry) MS (MALDI-TOF) m/z: [M]+, 643.12; Found, 643.92.

(1-5) Synthesis of 4-(2-octyldodecyl)-2,7-bis(trimethylstannyl)dithieno[3,2-b:2',3'-d]pyridin-5(4H)-one (Compound 5)

A Schlenk flask was charged with Compound 4 (1.50 g, 2.32 mmol) and dehydrated tetrahydrofuran (30 mL) in a nitrogen atmosphere, the resultant mixture was cooled to −20 degrees Celsius. To the resultant, isopropylmagnesium chloride-lithium chloride (1.3 M in THF, 3.92 mL, 5.10 mmol) was slowly dripped. Thereafter, the resultant was stirred for 1 hour at the same temperature. Then, trimethyltin chloride (1.39 g, 6.96 mmol) was added to the resultant, and the resultant mixture was stirred at room temperature overnight. After removing the solvent by an evaporator, an excessive amount of water was added and an organic layer was extracted with hexane. After washing the organic layer with water, the resultant was dried with anhydrous sodium sulfate. After removing the solids through filtration, the solvent was removed by an evaporator to thereby obtain Compound 5 in the state of yellowish brown oil (1.75 g, yield: 93%).

(NMR Spectrum Values)

$^1$H-NMR (400 MHz, CDCl3) delta 7.76 (s, 1H), 7.07 (s, 1H), 4.27-4.20 (m, 2H), 2.02-1.94 (m, 1H), 1.65-1.51 (m, 4H), 1.40-1.20 (m, 32H), 0.89-0.86 (m, 6H), 0.45 (s, 9H), 0.42 (s, 9H).

(Result of Mass Spectrometry)

MS (MALDI-TOF) m/z: [M]+, 813.22; Found, 814.02.

(1-6) Synthesis of 2,2'-(((4-(2-octyldodecyl)-5-oxo-4,5-dihydrodithieno[3,2-b:2',3'-d]pyridine-2,7-diyl)bis(3,4'-dihexyl-[2,2'-bithiophene]-5',5-diyl))bis(methaneylylidene)) bis(1H-indene-1,3(2H)-dione) (Compound 6 (Exemplary Compound 3))

A Schlenk flask was charged with Compound 5 (0.488 g, 0.60 mmol), 2-((5-bromo-3,4-dihexyl-[2,2-bithiophen]-5-yl)methylene)-1H-indene-1,3(2H)-dione (0.684 g, 1.20 mmol), tetrakis(triphenylphosphine)palladium(0) (0.016 g, 0.014 mmol), and dimethylformamide (50 mL) in a nitrogen atmosphere, and bubbling was performed for 5 minutes by introducing nitrogen gas into a solution of the mixture. Thereafter, the solution was stirred at 80 degrees Celsius overnight. After returning the system to room temperature, an excessive amount of methanol was added to precipitate black solids and the black solids were collected by filtration. The obtained solids were purified by silica gel column chromatography (mobile phase:hexane/chloroform=1:3, v/v) and the resultant was further purified by GPC to thereby obtain Exemplary Compound 3 in the state of dark deep blue solids (0.260 g, yield: 30%).

(NMR Spectrum Values)

$^1$H-NMR-NMR (400 MHz, CDCl3): delta 8.01-7.93 (m, 4H), 7.90 (s, 1H), 7.89 (s, 1H), 7.82-7.74 (m, 7H), 7.35 (s, 1H), 7.34 (s, 1H), 7.13 (s, 1H), 4.31-4.18 (m, 2H), 2.92-2.83 (m, 8H), 2.10-1.99 (m, 1H), 1.81-1.70 (m, 8H), 1.51-1.17 (m, 56H), 0.96-0.89 (m, 12H), 0.85 (m, 6H).

(Result of Mass Spectrometry)

MS (MALDI-TOF) m/z: [M]+, 1463.66; Found, 1464.53. Anal.

Synthesis of Exemplary Compound 10

(2-1) Synthesis of 4-(2-octyldodecyl)-2-(trimethylstannyl) dithieno[3,2-b:2',3'-d]pyridin-5(4H)-one (Compound 7)

A Schlenk flask was charged with Compound 3 (976 mg, 2.00 mmol) and dehydrated tetrahydrofuran (10 mL) in a nitrogen atmosphere and the resultant mixture was cooled to −78 degrees Celsius. To the resultant mixture, lithium diisopropylamide (0.394 M in THF, 6.6 mL, 2.6 mmol) was slowly dripped, and the resultant solution was stirred for 1 hour at −40 degrees Celsius. Thereafter, trimethyltin chloride (797 mg, 4.00 mmol) was added to the solution, and the resultant was stirred at room temperature overnight. After removing the solvent by an evaporator, an excessive amount of water was added and an organic layer was extracted with hexane. After washing the organic layer with water, the organic layer was dried with anhydrous sodium sulfate. After removing solids through filtration, the solvent was removed by an evaporator to thereby obtain Compound 7 in the state of yellowish brown oil (1.218 g, yield: 94%).
(NMR Spectrum Values)

$^1$H-NMR-NMR (400 MHZ, CDCl3): delta 7.69 (d, J=5.5 Hz, 1H), 7.20 (d, J=5.3 Hz, 1H), 7.08 (s, 1H), 4.28-4.17 (m, 2H), 2.04-1.95 (m, 1H), 1.60-1.13 (32H), 0.90-0.86 (m, 6H), 0.46 (s, 9H).
(Result of Mass Spectrometry)

MS (MALDI-TOF) m/z: [M]+, 651.26; Found, 652.26.
(2-2) Synthesis of 2-((3,4'-dihexyl-5'-(4-(2-octyldodecyl)-5-oxo-4,5-dihydrodithieno[3,2-b:2',3'-d]pyridin-2-yl)-[2,2'-bithiophen]-5-yl)methylene)-1H-indene-1,3(2H)-dione (Compound 8)

A Schlenk flask was charged with Compound 7 (1.041 g, 1.60 mmol), 2-45'-bromo-3,4'-dihexyl-[2,2'-bithiophen]-5-yl)methylene)-1H-indene-1,3(2H)-dione (0.911 g, 1.60 mmol), tetrakis(triphenylphosphine)palladium(0) (56 mg, 0.050 mmol), and dimethylformamide (10 mL) in a nitrogen atmosphere, and bubbling was performed for 5 minutes by introducing nitrogen gas to the solution. Thereafter, the solution was stirred at 70 degrees Celsius overnight. After returning the system to room temperature, an excessive amount of methanol was added to precipitate black solids and the black solids were collected by filtration. The obtained solids were purified by silica gel column chromatography (mobile phase:hexane/chloroform=3.5:6.5, v/v) and the resultant was reprecipitated with methanol/chloroform to thereby obtain Compound 8 in the state of black solids (0.769 g, yield: 49%).
(NMR Spectrum Values)

$^1$H-NMR-NMR (400 MHZ, CDCl$_3$): delta 8.00-7.94 (m, 2H), 7.90 (s, 1H), 7.82-7.77 (m, 3H), 7.72 (d, J=5.3 Hz, 1H), 7.34 (s, 1H), 7.25 (d, 1H), 7.14 (s, 1H), 4.29-4.19 (m, 2H), 2.91-2.84 (m, 4H), 2.09-1.99 (m, 1H), 1.79-1.70 (m, 4H), 1.49-1.18 (m, 44H), 0.94-0.82 (m, 12H).
(Result of Mass Spectrometry)

MS (MALDI-TOF) m/z: [M]+, 975.48; Found, 976.89.
(2-3) Synthesis of 2-((5'-(7-bromo-4-(2-octyldodecyl)-5-oxo-4,5-dihydrodithieno[3,2-b:2',3'-d]pyridin-2-yl)-3,4'-dihexyl-[2,2'-bithiophen]-5-yl)methylene)-1H-indene-1,3 (2H)-dione (Compound 9)

A Schlenk flask was charged with Compound 8 (684 mg, 0.700 mmol) and dehydrated tetrahydrofuran (30 mL) in a nitrogen atmosphere, and the resultant mixture was cooled to 0 degrees Celsius. After slowly adding N-bromosuccinimide (131 mg, 0.735 mmol) to the resultant mixture, the resultant was stirred for 14 hours at room temperature in the light-shield state. An excessive amount of water was added to the resultant and an organic layer was extracted with hexane. After washing the organic layer with water, the organic layer was dried with anhydrous sodium sulfate. After removing solids through filtration, the solvent was removed by an evaporator, and the resultant was reprecipitated with chloroform/methanol to thereby obtain Compound 9 in the state of black solids (660 mg, yield: 89%).

(NMR Spectrum Values)

$^1$H-NMR (400 MHZ, CDCl$_3$) delta 8.00-7.95 (m, 2H), 7.89 (s, 1H), 7.81-7.77 (m, 3H), 7.67 (s, 1H), 7.33 (s, 1H), 7.11 (s, 1H), 4.25-4.15 (m, 2H), 2.90-2.82 (m, 4H), 2.06-1.97 (m, 1H), 1.77-1.69 (m, 4H), 1.49-1.18 (m, 44H), 0.95-0.82 (m, 12H).
(Result of Mass Spectrometry)

M (MALDI-TOF) m/z: [M]+, 1053.39; Found, 1053.72.
(2-4) Synthesis of 2,2'-(((4,4'-bis(2-octyldodecyl)-5,5'-dioxo-4,4',5,5'-tetrahydro-[7,7'-bidithieno[3,2-b:2',3'-d]pyridine]-2,2'-diyl)bis(3,4'-dihexyl-[2,2'-bithiophene]-5',5-diyl))bis(methaneylylidene))bis(1H-indene-1,3(2H)-dione) (Compound 10 (Exemplary Compound 10))

A Schlenk flask was charged with Compound 9 (632 mg, 0.60 mmol), hexanemethyldithin (99 mg, 0.30 mmol), tetrakis(triphenylphosphine)palladium(0) (0.020 g, 0.017 mmol), and dimethylformamide (20 mL) in a nitrogen atmosphere, bubbling was performed for 5 minutes by introducing nitrogen gas to a solution of the mixture. Thereafter, the solution was stirred at 80 degrees Celsius overnight. After returning the system to room temperature, an excessive amount of methanol was added to precipitate black solids and the black solids were collected by filtration. The solids were washed with methanol and hexane and the obtained solids were purified by silica gel column chromatography (mobile phase:hexane/chloroform=1:3, v/v). The resultant was further purified by GPC to thereby obtain Exemplary Compound 10 in the state of black solids (128 mg, yield: 24%).
(NMR Spectrum Values)

$^1$H-NMR (400 MHZ, CDCl$_3$) delta 7.96-7.87 (m, 4H), 7.78-7.70 (m, 6H), 7.62 (s, 2H), 7.21 (s, 2H), 6.99 (s, 2H), 4.29-4.12 (m, 4H), 2.87-2.78 (m, 8H), 2.04-1.95 (m, 2H), 1.79-1.70 (m, 8H), 1.53-1.18 (m, 88H), 0.99-0.92 (m, 12H), 0.86-0.81 (12H).
(Result of Mass Spectrometry)

MS (MALDI-TOF) m/z: [M]+, 1948.94; Found, 1949.43. Anal.

Synthesis of Exemplary Compound 17

(3-1) Synthesis of N-(2-hexyldecyl)thiophene-3-amine (Compound 11)

Under the light-shielded conditions, a Schlenk flask was charged with 3-bromothiophene (8.15 g, 50.0 mmol), 2-hexyldecan-1-amine (14.5 g, 60.0 mmol), a copper powder (0.31 g, 5.0 mmol), copper(I) iodide (0.95 g, 5.0 mmol), tripotassium phosphate (21.2 g, 100 mmol), and 2-dimethylaminoethanol (50 mL) in a nitrogen atmosphere, the resultant mixture was stirred for 45 minutes at 80 degrees Celsius. After returning the system to room temperature, pure water was added to the reaction solution, and extraction was performed with hexane. Thereafter, the resultant was dried with sodium sulfate and the solvent was removed by an evaporator set to 35 degrees Celsius. The resultant was purified by silica gel column chromatography (hexane:chloroform=4:1) to thereby obtain Compound 11 in the state of an oily brown liquid (7.98 g, yield: 42%).
(NMR Spectrum Values)

$^1$H-NMR (400 MHz, CDCl$_3$): delta 7.14 (dd, J=5.0, 3.0 Hz, 1H), 6.61 (dd, J=5.0, 1.5 Hz, 1H), 5.91 (dd, J=3.0, 1.5 Hz, 1H), 3.59 (br, 1H), 2.97 (d, J=6.0 Hz, 2H), 1.67-1.48 (m, 1H), 1.39-1.15 (m, 24H), 0.88 (t, J=6.8 Hz, 6H).
(3-2) Synthesis of 2,5-dibromo-N1,N4-bis(2-hexyldecyl)-N1,N4-di(thiophen-3-yl)terephthalamide (Compound 12)

A Schlenk flask was charged with 2,5-dibromoterephtalic acid (3.03 g, 9.36 mmol), dehydrated dichloromethane (52 mL), and dehydrated N,N-dimethylformamide (DMF) (2 drops) in a nitrogen atmosphere. To the resultant mixture, oxalyl chloride (3.56 g, 28.1 mmol) was dripped, and the resultant mixture was stirred for 20 hours at room temperature. After removing the solvent and the excess oxalyl chloride under the reduced pressure, dehydrated dichloromethane (16 mL) was added, and the resultant was cooled to 0 degrees Celsius in an iced bath. After slowly adding Compound 11 (7.82 g, 20.6 mmol), trimethylamine (1.8 mL), and dehydrated dichloromethane (20 mL) to the resultant, the resulting mixture was stirred for 20 hours at room temperature.

After adding pure water to the reaction solution and performing extraction with hexane, the resultant was dried with sodium sulfate and the solvent was removed by an evaporator. The resultant was purified by silica gel column chromatography (hexane:chloroform=2:1) to thereby obtain Compound 12 in the state of an oily dark green liquid (8.68 g, yield: 99%).

(NMR Spectrum Values)

$^1$H-NMR (400 MHz, CDCl$_3$): delta 7.13 (dd, J=5.1, 3.1 Hz, 2H), 7.08 (s, 2H), 6.84 (dd, J=1.8 Hz, 2H), 6.76 (dd, J=5.1, 1.4 Hz, 2H), 3.77 (br, 4H), 1.61-1.51 (m, 2H), 1.43-1.08 (m, 48H), 0.93-0.83 (m, 12H)

(Result of Mass Spectrometry)

MS (MALDI-TOF) m/z: [M]+, 934.35; Found, 934.43.

(3-3) Synthesis of 4,10-bis(2-hexyldecyl)-4,10-dehydrothieno[2',3':5,6]pyrido[3,4-g]thieno[3,2-c]isoquinoline-5,11-dione (Compound 13)

A Schlenk flask was charged with Compound 12 (7.06 g, 7.55 mmol), dehydrated DMAc (270 mL), tricyclohexylphosphonium tetrafluoroborate (2.88 g, 7.83 mmol), cesium carbonate (30.7 g, 94.2 mmol), and palladium(II) acetate (1.09 g, 4.86 mmol) in a nitrogen atmosphere, and the resultant mixture was stirred for 5 hours at 120 degrees Celsius.

After returning the system to room temperature, the resultant was filtered with celite, and the solvent was removed by an evaporator and a vacuum pump. After adding pure water to the resultant and extracting with chloroform, the resultant was dried with sodium sulfate and the solvent was removed by an evaporator. The resultant was purified by silica gel column chromatography (hexane:chloroform=4:5) and was reprecipitated with chloroform and methanol to thereby obtain Compound 13 in the state of yellow solids (4.46 g, yield: 76%).

(NMR Spectrum Values)

$^1$H-NMR (400 MHz, CDCl$_3$): delta 8.88 (s, 2H), 7.49 (d, J=5.5 Hz, 2H), 7.10 (d, J=5.5 Hz, 2H), 4.31-4.16 (d, 4H), 2.08-1.98 (br, 2H), 1.44-1.18 (m, 48H), 0.84 (t, 12H).

(Result of Mass Spectrometry)

MS (MALDI-TOF) m/z: [M]+, 772.50; Found, 772.27.

(3-4) Synthesis of 4,10-bis(2-hexyldecyl)-2,8-bis(trimethylstannyl)-4,10-dihydrothieno[2',3':5,6]pyrido[3,4-g]thieno[3,2-c]isoquinoline-5,11-dione (Compound 14)

A Schlenk flask was charged with Compound 13 (0.77 g, 1.0 mmol), dehydrated THF (70 mL), and N,N,N',N'-tetramethylethylenediamine (0.31 mL, 2.1 mmol), and the resultant mixture was stirred for 30 minutes at 0 degrees Celsius. To the resultant, lithium diisopropylamide (LDA) (8.1 mL, 4.0 mmol) was slowly dripped, and the resultant mixture was stirred for 2 hours at 0 degrees Celsius. Thereafter, trimethyltin chloride (0.60 g, 5.0 mmol) was added, and the resultant mixture was returned to room temperature and stirred overnight. After removing the solvent by an evaporator set to 40 degrees Celsius, pure water was added, and extraction was performed with hexane and toluene. Thereafter, the resultant was dried with sodium sulfate and the solvent was removed by an evaporator, to thereby obtain Compound 14 in the state of brown solids (1.12 g, yield: quant.).

(NMR Spectrum Values)

$^1$H-NMR (400 MHz, CDCl$_3$): delta 8.88 (s, 2H), 7.10 (s, 1H), 4.26 (d, J=5.5 Hz, 4H), 2.07-1.99 (br, 2H), 1.46-1.15 (m, 48H), 0.88-0.81 (m, 12H), 0.49-0.45 (m, 18H)

(Result of Mass Spectrometry)

MS (MALDI-TOF) m/z: [M]+, 1098.43; Found, 1097.62.

(3-5) Synthesis of (2,2'-(((4,10-bis(2-hexyldecyl)-5,11-dioxo-4,5,10,11-tetrahydrothieno[2',3':5,6]pyrido[3,4-g]thieno[3,2-c]isoquinoline-2,8-diyl)bis(3,4'-dihexyl-[2,2'-bithiophene]-5',5-diyl)) bis(methaneylylidene))bis(1H-indene-1,3(2H)-dione)) (Compound 14 (Exemplary Compound 17))

A Schlenk flask was charged with Compound 14 (1.0 g, 0.91 mmol), 2-((5'-bromo-3,4'-dihexyl-[2,2'-bithiophen]-5-yl)methylene)-1H-indene-1,3(2H)-dione (1.09 g, 1.91 mmol), tetrakis(triphenylphosphine)palladium(0) (0.042 g, 0.036 mmol), and dehydrated DMF (90 mL) in a nitrogen atmosphere, and the resultant mixture was stirred for 15 hours at 80 degrees Celsius. After returning the system to room temperature, an excessive amount of methanol was added to the reaction solution to purify the precipitated solids by silica gel column chromatography (hexane:chloroform=1:2). The resultant was further purified by GPC, followed by performing reprecipitation with chloroform and methanol, to thereby obtain Exemplary Compound 17 in the state of dark deep blue solids (0.81 g, yield: 51%).

(NMR Spectrum Values)

$^1$H-NMR (400 MHz, CDCl$_3$): delta 8.80 (s, 2H), 8.00-7.92 (m, 4H), 7.86 (s, 2H), 7.81-7.75 (m, 6H), 7.32 (s, 2H), 7.13 (s, 2H), 4.27 (s, 4H), 2.92-2.84 (m, 8H), 2.13-1.98 (br, 2H), 1.82-1.70 (m, 8H), 1.54-1.18 (m, 72H), 0.97-0.90 (m, 12H), 0.86-0.79 (m, 12H).

$^{13}$C-NMR (101 MHz, CDCl3): delta 190.26, 189.72, 161.44, 145.30, 144.22, 142.07, 141.78, 141.15, 140.56, 139.54, 135.90, 135.59, 135.01, 134.88, 134.81, 134.13, 132.48, 130.91, 129.61, 126.89, 124.07, 123.64, 123.00, 122.80, 118.07, 115.67, 37.25, 31.89, 31.84, 31.80, 31.68, 30.55, 30.12, 30.04, 29.74, 29.57, 29.50, 29.45, 29.37, 29.31, 29.28, 26.76, 22.75, 22.69, 22.66, 14.12, 14.08.

(Result of Mass Spectrometry)

MS (MALDI-TOF) m/z: [M]+, 1749.86; Found, 1749.43. Anal. Calcd (%) for $C_{82}H_{114}N_2O_2S_{10}$: C, 74.09; H, 7.87; N, 1.68. found: C, 74.10; H, 7.83; N, 1.60.

Synthesis of Exemplary Compound 24

Synthesis of 2,2'-(((4,10-bis(2-hexyldecyl)-5,11-dioxo-4,5,10,11-tetrahydrothieno[2',3':5,6]pyrido[3,4-g]thieno[3,2-c]isoquinoline-2,8-diyl)bis(3,4'-dihexyl-[2,2'-bithiophene]-5',5-diyl)) bis(methaneylylidene))bis(4,7-difluoro-1H-indene-1,3(2H)-dione) (Exemplary Compound 24)

A Schlenk flask was charged with Compound 14 (0.049 g, 0.045 mmol), 2-((5'-bromo-3,4'-dihexyl-[2,2'-bithiophen]-5-yl)methylene)-4,7-difluoro-1H-indene-1,3(2H)-dione(0.058 g, 0.095 mmol), and dehydrated toluene (6 mL) in a nitrogen atmosphere. To the resultant mixture, tris(dibenzylideneacetone)dipalladium(0) (0.0016 g, 0.0018 mmol) and tri(o-tolyl)phosphine (0.0025 g, 0.0081 mmol) were added, and the resultant mixture was stirred at 100 degrees Celsius overnight. After returning the system to room temperature, an excessive amount of methanol was added to the reaction solution to precipitate solids, and the solids were reprecipitated with chloroform and methanol, to thereby obtain Exemplary Compound 24 in the state of dark deep blue solids (0.07 g, yield: 85%).

(NMR Spectrum Values)

$^1$H-NMR (400 MHz, CDCl$_3$) delta 8.83 (s, 2H), 7.91 (s, 2H), 7.83 (s, 2H), 7.39 (t, J=5.3 Hz, 4H), 7.37 (s, 2H), 7.16 (s, 2H), 4.28 (br, 4H), 2.89 (t, J=7.7 Hz, 8H), 2.10 (br, 2H), 1.83-1.70 (m, 8H), 1.50-1.15 (m, 72H), 0.97-0.89 (m, 12H), 0.88-0.79 (m, 12H).

(Result of Mass Spectrometry)

MS (MALDI-TOF) m/z: [M]+, 1821.84; Found, 1822.51. Anal.

Example 1

(Production of Electron-Transporting Layer)

Zinc acetate (available from Sigma-Aldrich Co., LLC) in an amount of 1 g, 0.28 g of ethanolamine (available from Sigma-Aldrich Co., LLC), and 10 mL of methoxyethanol (available from Wako Pure Chemical Industries, Ltd.) were stirred overnight at room temperature to thereby prepare a zinc oxide precursor solution. The zinc oxide precursor solution was applied onto an ITO substrate by spin coating in a manner that a film thickness was to be 20 nm, and the applied solution was dried for 10 minutes at 200 degrees Celsius, to thereby form an electron-transporting layer.

(Production of Photoelectric Conversion Layer)

In 1 mL of chloroform including 3% by volume of 1,8-diiodooctane, 18 mg of Exemplary Compound 3 and 12 mg of PC71BM (available from Frontier Carbon Corporation) were dissolved to prepare a photoelectric conversion solution. Onto the above-described electron-transporting layer, the photoelectric conversion solution was applied by spin coating in a manner that a film thickness was to be 200 nm, to thereby form a photoelectric conversion layer.

(Production of Hole-Transporting Layer and Metal Electrode)

On the photoelectric conversion layer, molybdenum oxide (available from KOJUNDO CHEMICAL LABORATORY CO., LTD.) in the thickness of 10 nm, and silver in the thickness of 100 nm were sequentially formed by vacuum vapor deposition, to thereby produce a solar battery cell.

Short-circuit current density of the obtained photoelectric conversion element with irradiation of white LED (34 microwatt/cm$^2$) was measured.

The measurement was performed by using a desk lamp CDS-90 alpha available from Cosmotechno Co., Ltd. as the white LED, and a solar battery evaluation system As-510-PV03 available from NF Corporation as the evaluation device. The output of the LED light source was measured by means of a color meter C-7000 available from SEKONIC CORPORATION. The evaluation result was presented in Table 2.

Example 2

A solar battery cell was produced and evaluated in the same manner as in Example 1, except that Exemplary Compound 3 was replaced with Exemplary Compound 10. The evaluation result was presented in Table 2.

Example 3

A solar battery cell was produced and evaluated in the same manner as in Example 1, except that Exemplary Compound 3 was replaced with Exemplary Compound 17. The evaluation result was presented in Table 2.

Comparative Example 1

A solar battery sell was produced and evaluated in the same manner as in Example 1, except that Exemplary Compound 3 was replaced with Comparative Compound 1 disclosed in NPL 1 and the photoelectric conversion solution was replaced with the following photoelectric conversion solution. Comparative Compound 1 was synthesized by the method disclosed in NPL 1. The evaluation result was presented in Table 2.

(Photoelectric Conversion Layer)

In 1 mL of chlorobenzene including 3% by volume of 1,8-diiodooctane, 10 mg of Comparative Compound 1 below and 12 mg of PC71BM (available from Frontier Carbon Corporation), to thereby produce a photoelectric conversion solution. The photoelectric conversion solution was applied onto the electron-transporting layer by spin coating in a manner that a film thickness was to be 200 nm, to thereby form a photoelectric conversion layer.

Comparatuve Compound 1

Comparative Example 2

A solar battery cell was produced and evaluated in the same manner as in Example 1, except that Exemplary Compound 3 was replaced with 6 mg of PTB7 (1-Material), the amount of PC71BM was changed to 9 mg, the amount of 1,8-diiodooctane was changed to 1% by volume, and the solvent was changed to chlorobenzene. The evaluation result is presented in Table 2.

Comparative Example 3

An amorphous silicon solar cell AM-1801 available from Panasonic Corporation was evaluated by the measuring method described in Example 1. The result is presented in Table 2.

TABLE 2

| | Short-circuit current density ($\mu A/cm^2$) |
|---|---|
| Ex. 1 | 26.8 |
| Ex. 2 | 21.2 |
| Ex. 3 | 22.3 |
| Comp. Ex. 1 | 16.1 |
| Comp. Ex. 2 | 15.2 |
| Comp. Ex. 3 | 18.2 |

The photoelectric conversion elements produced using the obtained organic material in the present disclosure in the above-described manner had high short-circuit current density with very weal light of 34 microwatt/cm$^2$ and were excellent photoelectric conversion materials compared with the comparative photoelectric conversion elements.

For example, embodiments of the present disclosure are described in (1) to (9) below.
(1) An organic material represented by General Formula (1):

General Formula (1)

where, in General Formula (1), $R_1$ is an alkyl group having 6 carbon atoms or more but 20 carbon atoms or less; n is an integer of from 1 through 3; X1 to X4 are each a hydrogen atom or a fluorine atom; and Z is a compound represented by General Formula (2), (3), or (4) below:

General Formula (2)

General Formula (3)

General Formula (4)

where, in General Formulae (2) to (4), $R_2$, $R_3$, and $R_4$ are each an alkyl group having 6 carbon atoms or more but 20 carbon atoms or less; and Y is an oxygen atom or a sulfur atom.

(2) The organic material according to (1),
wherein the organic material represented by General Formula (1) is a compound represented by General Formula (5):

General Formula (5)

where, in General Formula (5), $R_5$ is an alkyl group having 12 carbon atoms or more but 20 carbon atoms or less; $R_6$ is an alkyl group having 6 carbon atoms or more but 12 carbon atoms or less; X1 to X4 are each a hydrogen atom or a fluorine atom; Y is an oxygen atom or a sulfur atom; and n is an integer of from 1 through 3.

(3) The organic material according to (1),
wherein the organic material represented by General Formula (1) is a compound represented by General Formula (6):

General Formula (6)

where, in General Formula (6), $R_7$ is an alkyl group having from 12 carbon atoms through 20 carbon atoms; $R_8$ is an alkyl group having from 6 carbon atoms through 12 carbon atoms; X1 to X4 are each a hydrogen atom or a fluorine atom; Y is an oxygen atom or a sulfur atom; and n is an integer of from 1 through 3.

(4) The organic material according to (1),
wherein the organic material represented by General Formula (1) is a compound represented by General Formula (7):

General Formula (7)

where, in General Formula (7), $R_9$ is an alkyl group having from 12 carbon atoms through 20 carbon atoms; $R_{10}$ is an alkyl group having from 6 carbon atoms through 12 carbon atoms; X1 to X4 are each a hydrogen atom or a fluorine atom; Y is an oxygen atom or a sulfur atom; and n is an integer of from 1 through 3.

(5) The organic material according to (2),
wherein, in General Formula (5), n is 1 or 2 and Y is an oxygen atom.

(6) The organic material according to (3),
wherein, in General Formula (6), n is 1 or 2 and Y is an oxygen atom.

(7) The organic material according to (4),
wherein, in General Formula (7), n is 1 or 2 and Y is an oxygen atom.

(8) A photoelectric conversion element, including:
a substrate;
a first electrode;
an electron-transporting layer;
a photoelectric conversion layer;
a hole-transporting layer; and
a second electrode, where the first electrode, the electron-transporting layer, the photoelectric conversion layer, the hole-transporting layer, and the second electrode are laminated on the substrate,
wherein the photoelectric conversion layer includes the organic material according to any one of (1) to (7), and a n-type semiconductor material.

(9) The photoelectric conversion element according to (8), wherein the photoelectric conversion layer includes the n-type semiconductor material that is a fullerene derivative.

REFERENCE SIGNS LIST

1: substrate
2: first electrode

3: electron-transporting layer
4: photoelectric conversion layer
5: hole-transporting layer
6: second electrode

The invention claimed is:

1. An organic material represented by General Formula (6) or by General Formula (7):

General Formula (6)

where, in General Formula (6), $R_7$ is an alkyl group having from 12 carbon atoms through 20 carbon atoms; $R_8$ is an alkyl group having from 6 carbon atoms through 12 carbon atoms; X1 to X4 are each a hydrogen atom or a fluorine atom; Y is an ox Tgen atom or a sulfur atom; and n is an integer of from 1 through 3;

General Formula (7)

where, in General Formula (7), $R_9$ is an alkyl group having from 12 carbon atoms through 20 carbon atoms; $R_{10}$ is an alkyl group having from 6 carbon atoms through 12 carbon atoms; X1 to X4 are each a hydrogen atom or a fluorine atom; Y is an oxygen atom or a sulfur atom; and n is an integer of from 1 through 3.

2. The organic material according to claim 1,
wherein the organic material is a compound represented by General Formula (6).

3. The organic material according to claim 1,
wherein the organic material is a compound represented by General Formula (7).

4. The organic material according to claim 2,
wherein, in General Formula (6), n is 1 or 2 and Y is an oxygen atom.

5. The organic material according to claim 3,
wherein, in General Formula (7), n is 1 or 2 and Y is an oxygen atom.

6. A photoelectric conversion element, comprising:
a substrate:
a first electrode:
an electron-transporting layer;
a photoelectric conversion layer;
a hole-transporting layer; and
a second electrode, where the first electrode, the electron-transporting layer, the photoelectric conversion layer, the hole-transporting layer, and the second electrode are laminated on the substrate,
wherein the photoelectric conversion layer includes the organic material according to claim 1, and an n-type semiconductor material.

7. The photoelectric conversion element according to claim 6,
wherein the photoelectric conversion layer includes the n-type semiconductor material that is a fullerene derivative.

* * * * *